US010739393B2

(12) United States Patent
Cobanoglu et al.

(10) Patent No.: US 10,739,393 B2
(45) Date of Patent: Aug. 11, 2020

(54) WEARABLE DEVICE AND A METHOD FOR DETERMINING INDUCED VOLTAGE EXPOSURE OF A HUMAN BODY TO RF RADIATION AND STATIC ELECTRICITY VARIATION

(71) Applicant: Sanko Tekstil Isletmeleri San. Ve Tic. A.S., Inegol-Bursa (TR)

(72) Inventors: Özgür Cobanoglu, Inegol-Bursa (TR); Jitka Eryilmaz, Inegol-Bursa (TR); Fehim Caglar, Inegol-Bursa (TR); Ertug Erkus, Inegol-Bursa (TR)

(73) Assignee: Sanko Tekstil Isletmeleri San. Ve Tic. A.S., Inegol-Bursa (TR)

( * ) Notice: Subject to any disclaimer, the term of this patent is extended or adjusted under 35 U.S.C. 154(b) by 159 days.

(21) Appl. No.: 15/882,668

(22) Filed: Jan. 29, 2018

(65) Prior Publication Data

US 2018/0217191 A1    Aug. 2, 2018

(30) Foreign Application Priority Data

Jan. 31, 2017  (EP) .................................... 17153864
Mar. 2, 2017   (EP) .................................... 17158960

(51) Int. Cl.
*G01R 29/12* (2006.01)
*G01R 29/08* (2006.01)
(Continued)

(52) U.S. Cl.
CPC ......... *G01R 29/0857* (2013.01); *G01R 29/12* (2013.01); *G01R 29/14* (2013.01);
(Continued)

(58) Field of Classification Search
CPC ........ G01R 29/12; G01R 29/14; G01R 29/24; G01R 31/001; H01L 2924/0002; H01L 2924/00; H01L 2224/48091
(Continued)

(56) References Cited

U.S. PATENT DOCUMENTS

2002/0075189 A1   6/2002 Carillo et al.
2011/0221416 A1*  9/2011 Ivanov ...................... G05F 1/67
                                                        323/285
(Continued)

FOREIGN PATENT DOCUMENTS

EP     0600143    6/1994
WO     3501358    3/1985

OTHER PUBLICATIONS

Lemey Sam et al "Textile Antennas as hybrid energy-harvesting platforms" Proceeding of the IEEE, New York, Us. vol. 1 102, No. 11—Nov. 1, 2014.
(Continued)

*Primary Examiner* — Paul J Rios Russo

(57) ABSTRACT

A wearable device and a method are disclosed for determining induced voltage exposure of a human body to low voltage fluctuations or induced static electricity variation on human body. The wearable device includes conductive elements which form at least part of an antenna and comprises an RF-to-DC converter connected to the conductive elements of the wearable device for harvesting RF energy and induced static electricity variation at the input in the form of an AC voltage ($V_{in}$), while the RF-to-DC converter provides a DC voltage ($V_{out}$) at the output. The wearable device also comprises a control unit connected to the output of the RF-to-DC converter to determine the induced voltage exposure of a device wearer's body.

17 Claims, 2 Drawing Sheets

(51) Int. Cl.
    *G01R 31/00* (2006.01)
    *G01R 29/14* (2006.01)
    *G01R 29/24* (2006.01)
(52) U.S. Cl.
    CPC ............ *G01R 29/24* (2013.01); *G01R 31/001* (2013.01); *H01L 2224/48091* (2013.01); *H01L 2924/00* (2013.01); *H01L 2924/0002* (2013.01)
(58) Field of Classification Search
    USPC .................................................. 324/457, 458
    See application file for complete search history.

(56) References Cited

U.S. PATENT DOCUMENTS

| | | | | |
|---|---|---|---|---|
| 2013/0281793 | A1* | 10/2013 | Chen | A61N 1/08 600/300 |
| 2015/0164422 | A1* | 6/2015 | Lee | A61B 5/14552 600/301 |
| 2015/0214841 | A1* | 7/2015 | Ramorini | H02M 3/158 323/271 |
| 2016/0020631 | A1* | 1/2016 | Manova-Elssibony | H02J 17/00 320/107 |
| 2016/0261031 | A1* | 9/2016 | Dion | H01Q 1/248 |
| 2017/0141820 | A1* | 5/2017 | Kim | H04B 1/40 |
| 2017/0338687 | A1* | 11/2017 | Manova-Elssibony | H01J 17/00 |

OTHER PUBLICATIONS

Search Report dated Oct. 12, 2017 for European priority application No. 17158960.9.

Valeri Vountesmeri et al "Magnetoresistive Power for Measurement in situ of RF Power Absorbed by Tissue" IEEE Transactions on instrumentation and measurement, IEEE Service Center, Piscataway, NY, US vol. 49, No. 3 Jun. 1, 2000.

* cited by examiner

WEARABLE DEVICE AND A METHOD FOR DETERMINING INDUCED VOLTAGE EXPOSURE OF A HUMAN BODY TO RF RADIATION AND STATIC ELECTRICITY VARIATION

RELATED APPLICATIONS

This application claims priority to European application No. 17153864.8 filed 31 Jan. 2017 and European application No. 17158960.9 filed 2 Mar. 2017, the contents of each of which are hereby incorporated by reference as if set forth in their entireties.

FIELD OF THE INVENTION

The present invention relates to a wearable device and a method for determining induced voltage exposure of a human body to low voltage fluctuations or induced static electricity variation on human body, as well as to the use of a wearable device for determining induced voltage exposure of a human body to RF radiation and induced static electricity variation.

It is known that human body can be easily charged with static electricity and is very sensitive to RF radiation that produces adverse effects on human body.

Humans wearing shoes or lying in bed are not electrically grounded, because shoes or beds isolate humans from the ground. Static electricity is a high voltage electricity and is an imbalance of the amounts of positive and negative charges in the surface of an object. There is always a strong electric field surrounding these charges and said electric field is considered as a voltage without a current. This voltage is fairly difficult to be actually measured, because the electrical resistance of a normal voltmeter will discharge the human body in a few thousands of a seconds.

Humans are exposed to "Electrosmog" through radiofrequency (RF) radiation, which is known as wireless or microwave radiation. RF radiation is an electromagnetic radiation and is comprised in the frequency range from 3 kHz to 300 GHz on the electromagnetic spectrum. Since RF radiation is a non-ionizing band, there is not enough energy to break chemical bonds between molecules, thus it does not cause biochemical alterations in human bodies. Notwithstanding, according to recent studies, RF radiation is harmful for humans. The established adverse health effects associated with RF field exposure in the frequency range from 3 kHz to 300 GHz relate to the occurrence of tissue heating and nerve stimulation (such as sleep disorder, headache, etc.) by short-term exposure.

STATE OF THE ART

There are numerous literature sources disclosing different types of devices for detecting and monitoring RF and/or electromagnetic radiations.

The US patent application published as US2002/075189 discloses a radiation detection device for measuring electromagnetic field or radio frequency or microwaves. Said radiation detection device is attached to an RF shielded wearable garment, such as a hat, or wearable accessories, such as eyeglasses, and is used to detect the efficiency of the shield. The operating frequencies are determined by tuning or fixing the antenna's specification as well as by tuning the impedance of the appropriate crystal detector. The antenna means of the device receives electromagnetic energy or radiofrequency energy and transform them into RF electrical signal outputting at an antenna device output terminal port that is connected to the crystal detector means that generates a converted monitoring DC voltage signal at said crystal detector output terminal port. A stimulus indicator means operates as a transducing means converting said monitoring DC voltage signal input into a verification indicator means output form.

The European patent application EP-0600143 relates to a wearable electromagnetic radiation monitor, which can comprise an audible and a visual alarm when RF radiations exceed a preset threshold. No reference is made to the possibility of integrating the circuit directly in a wearable device.

Other known prior art refers to RF-to-DC conversion for harvesting energy for low-power sensor nodes and in communication infrastructures, however, its use in wearable devices is not disclosed in the known prior art publication. In fact, wearable devices are not so attractive to be used in this field of application, because only a very small energy can be harvested.

The published document "Textile Antennas as Hybrid Energy Harvesting Platforms" (Lemey Sam et al.—PROCEEDINGS OF THE IEEE—IEEE NEW YORK, US, vol. 102, n. 11, 1 Nov. 2014, pages 1833-1857) discloses some embodiments of textile antennas in which hardware is incorporated for harvesting light and thermal body energy. Reference is also made to some known works about RF energy harvesting but the disclosed embodiments do not exploit this kind of energy harvesting. The antennas are used to transmit signals detected by sensors over well-defined frequency bands. The hardware is powered by the harvested energy stored in a micro-energy cell. This document states that proximity of the human body causes a reduced gain of the antenna and that zero interaction with the test person's body must be guaranteed.

WO 85/01358 discloses a device to monitor the RF radiation exposure to individuals at a plurality of frequency bands. The device can be attached to the clothing of a user by means of a non-conductive pin and latch assembly.

The published document "Magnetoresistive Power Sensor for Measurement in situ of RF Power Absorbed by Tissue" (Valeri Vountesmeri et al.—IEEE TRANSACTIONS ON INSTRUMENTATION AND MEASUREMENT, IEEE SERVICE CENTER, PISCATAWAY, N.J., US, vol. 49, no. 3, 1 Jun. 2000) discloses a power sensor device to detect instantaneous values of the RF current and voltage at a frequency of 915 MHz in order to determine the heating applied to a tissue by means of a RF-power applicator and maintain a substantially constant temperature of the tissue. The device uses magnetoresistors and a power sensor consisting of a microstrip line.

Based upon the state of the art, there is a need to provide a wearable device that is suitable for determining the induced voltage exposure of a human body to RF radiation or to static electricity, as well as a method for carrying out said determination of induced voltage exposure of a human body.

It is therefore a main object of the invention to provide a wearable device that is suitable for measuring, monitoring and determining the exposure to RF radiation and static electricity variations on humans' body as a display of potential harm/disturbance to the wearer him/her-self such that the wearer can minimize these effects by taking appropriate measures accordingly.

A further object of the invention is to provide a method for measuring, monitoring and determining induced voltage exposure on a human body to RF radiation or static electricity in a simple and easy way.

Another object of the invention is to provide a method for measuring, monitoring and determining induced voltage exposure of a human body to RF radiation or static electricity variations in a broad frequency range.

Another object of the invention is to provide a method for measuring, monitoring and determining induced voltage exposure of a human body to RF radiation or static electricity variations specific/unique to the person but not specific to the wearable device itself as the wearer as well—together with the wearable device—functions as the antenna means or the substrate on which the electronics probes onto.

SUMMARY OF THE INVENTION

These and other objects and advantages of the invention are accomplished by a wearable device as defined in claim 1 and a method as defined in claim 5.

A wearable device for determining induced voltage exposure of a human body to low voltage fluctuations or induced static electricity variation on human body according to the present invention includes conductive elements which form at least part of an antenna and comprises a RF-to-DC converter connected to the conductive elements for harvesting RF energy and induced static electricity variation at the input in the form of an AC voltage, the RF-to-DC converter providing a DC voltage at the output. The wearable device also comprises a control unit connected to the output of the RF-to-DC converter to determine the induced voltage exposure of a device wearer's body.

According to an embodiment, the conductive elements are incorporated in a fabric and configured to be in electrical contact to the wearer's body.

The wearable device and the wearer's body operate as an antenna for harvesting RF energy and induced static electricity for their elaboration by the control unit to monitor and determine voltage fluctuations in a given environment. The voltage fluctuations represent the RF radiation to which a wearer of said wearable device is exposed to.

The RF-to-DC converter comprises for example a diode/capacitor multiplier circuit which is attached to, or incorporated in, the fabric of the wearable device.

The control unit is programmed to set a threshold voltage value to be compared with the DC voltage value at the output of the RF-to-DC converter.

Also the control unit can be attached to, or incorporated in, the fabric used for the manufacturing of the wearable device.

The wearable device of the invention could be for example, but not exclusively, a part of a wrist watch, a necklace, an earring, a bangle, an Alice band, a shoe, a shirt, as well as a part of trousers such as jeans or the like, or actually anything having a good portion in contact with the skin of a wearer's body.

The wearable device of the present invention can be provided with conductive elements in a known way. For example, conductive elements can be made in the form of conductive filaments or yarns woven or knitted with non-conductive yarns into a fabric. Alternatively, conductive elements could be incorporated in labels, buttons or similar parts of the wearable device.

The control unit can incorporate the RF-to-DC converter and is programmed to operate as an RF exposure monitor, i.e. to elaborate the information corresponding to the energy detected by the antenna (wearer's body and wearable device).

The wearable device of the present invention allows monitoring and determining the amount of low-voltage fluctuations on the wearer's body as well as on the conductive elements of the wearable device by the use of RF-to-DC conversion technique (radio frequency energy, detected in form of AC current and converted into direct current), wherein the wearer's body and the conductive elements of the wearable device act as antennas. The energy continuously harvested is used to charge capacitors of the control unit with the induced AC currents. Subsequently, when the capacitors reach at a certain voltage level (i.e. a threshold), the capacitors are reset (i.e. discharged), a counter is incremented and the charging of the capacitors is repeated again, as well as the counting steps. Since the counter counts the number of capacitor discharges, the voltage fluctuations, which are measured by the control unit and expressed by the counter as an integer value, represent the amount of RF exposure.

Conventionally, RF-to-DC conversion is mainly used primarily for harvesting RF energy present in the air to power low-power electronic circuits. Its use in a wearable device is, however, not so attractive, because the harvested energy is rather low for charging a mobile device. According to the conventional use of RF-to-DC conversion technique, the antennas are generally solid, made of metal, have specific shapes and are fine tuned for specific frequencies (such as 900 MHz) in order to pick up the RF signals of that frequency. This maximizes the power conversion efficiency at that given frequency, however, this also makes the system completely transparent to other frequencies that might be present, affecting the environment.

In contrast to the prior art, the present invention uses the technique of harvesting RF energy and static electricity variation on conductive parts of a wearable device and on human's body wearing said device to monitor the quantity of power induced each day or unit of time on human's body and to give insight how to decrease the amount of static charge variation (i.e. to instruct the wearer where to go or not to go or stay longer, etc.). In addition, contrary to the prior art using solid antennas, the use of the wearer's body and the wearable device as antenna allows counting the charges which effectively induce currents on the human's body wearing a device of the present invention, and detecting RF energy in a broader frequency range with respect to the known conventional techniques working at specific frequencies.

According to another aspect of the present invention, a method is provided for determining the induced voltage exposure of a human's body wearing a device of the present invention. The method comprises the following steps:
   a) continuously harvesting RF energy or static electricity variation induced on the device wearer's body by means of the conductive elements and the wearer's body acting as antennas;
   b) feeding an RF-to-DC converter with a AC voltage from the harvesting step a) to charge the capacitors of the RF-to-DC converter in order to obtain a DC voltage at the output of the RF-to-DC converter;
   c) evaluating the amount of the induced voltage exposure on the basis of the DC voltage fed to a control unit of the wearable device.

The conductive elements can be incorporated in a fabric and configured to be in electrical contact to the wearer's body.

The detection of RF energy and/or static electricity according to the method of the present invention is carried out by means of the wearer's body and the conductive elements of the wearable device itself acting as antennas. The RF-to-DC converter of the control unit receives signals as AC current from said antennas and converts the detected energy into DC current. This RF-to-DC conversion is carried out according to the method of the present invention by charging the capacitors connected to the control unit with the induced alternating current, discharging the capacitors when they reach a predefined voltage level, i.e. a voltage threshold, incrementing the integer value of a counter each time the capacitors are discharged. Charging and discharging of the capacitors, as well as the counting steps, are continuously repeated.

In other words, the control unit is programmed to compare the output DC voltage of the RF-to-DC converter with a preset threshold voltage level and increase the integer value of a counter when the DC voltage exceeds the preset threshold voltage level. Each time the DC voltage exceeds the preset threshold voltage level, the capacitors are discharged and the counter is increased.

In particular, the comparison is carried out with a threshold voltage level which is stored in the control unit as a digital value and the output DC voltage of the RF-to-DC converter is transformed by the control unit from analog to digital form before the comparison.

The amount of exposure to RF radiation and static electricity variations on the wearer's body is thus indicated by the integer value of discharges stored in the counter. The stored integer value can be periodically read and, if needed, can be reset after the reading.

The detected voltage fluctuations on the wearer's body are in linear correlation with the amount of RF exposure reported by the counter of the control unit.

The present invention also refers to the use of a wearable device for determining the induced voltage exposure on a human's body to RF radiation and induced static electricity variation.

The wearable device of the present invention and the method of the present invention allow monitoring the amount of RF radiation to which the wearer is exposed. The method of the present invention allows detecting alternating electric fields and RF energy, while harvesting RF energy according to the present invention exploits human body and conductive elements of the wearable device as antenna.

Consequently, the present invention is not limited to a specific band as in the prior art and is operative in a large frequency range of the RF energy radiation which gets altered as different wearers would form different type of antennas or form antennas having different specifications, resulting in varying sensitivities to varying range of frequencies.

The method of the present invention provides "personalized" measurements of the amount of RF exposure on human's body wearing a device of the present invention, because every wearer acting as an antenna is different and has different geometric shapes, densities, electrolyte composition, therefore, different electronic models. Accordingly, different persons would pick up different frequencies or the same frequencies with varying weighing factors. These different "personal" features are included in the "counting" operation of the method of the present invention, wherein the number of capacitors' discharges is memorized. Therefore, the determination of voltage fluctuations on the wearer's body is "correct" only per wearer, i.e. it is relative, thus absolute values of the measurements from different wearers are not comparable but they are expected to be correlated. As an example, an electrofoggy area should increase the counter faster for all the wearers being within the area but the absolute counter numbers should not be expected to be the same as the wearers form antennas with different features.

BRIEF DESCRIPTION OF THE DRAWINGS

The foregoing and other features and aspects of the present invention will become more apparent from the following description of the exemplary embodiments illustrated in the accompanying drawings, in which.

DETAILED DESCRIPTION

Figure 1:
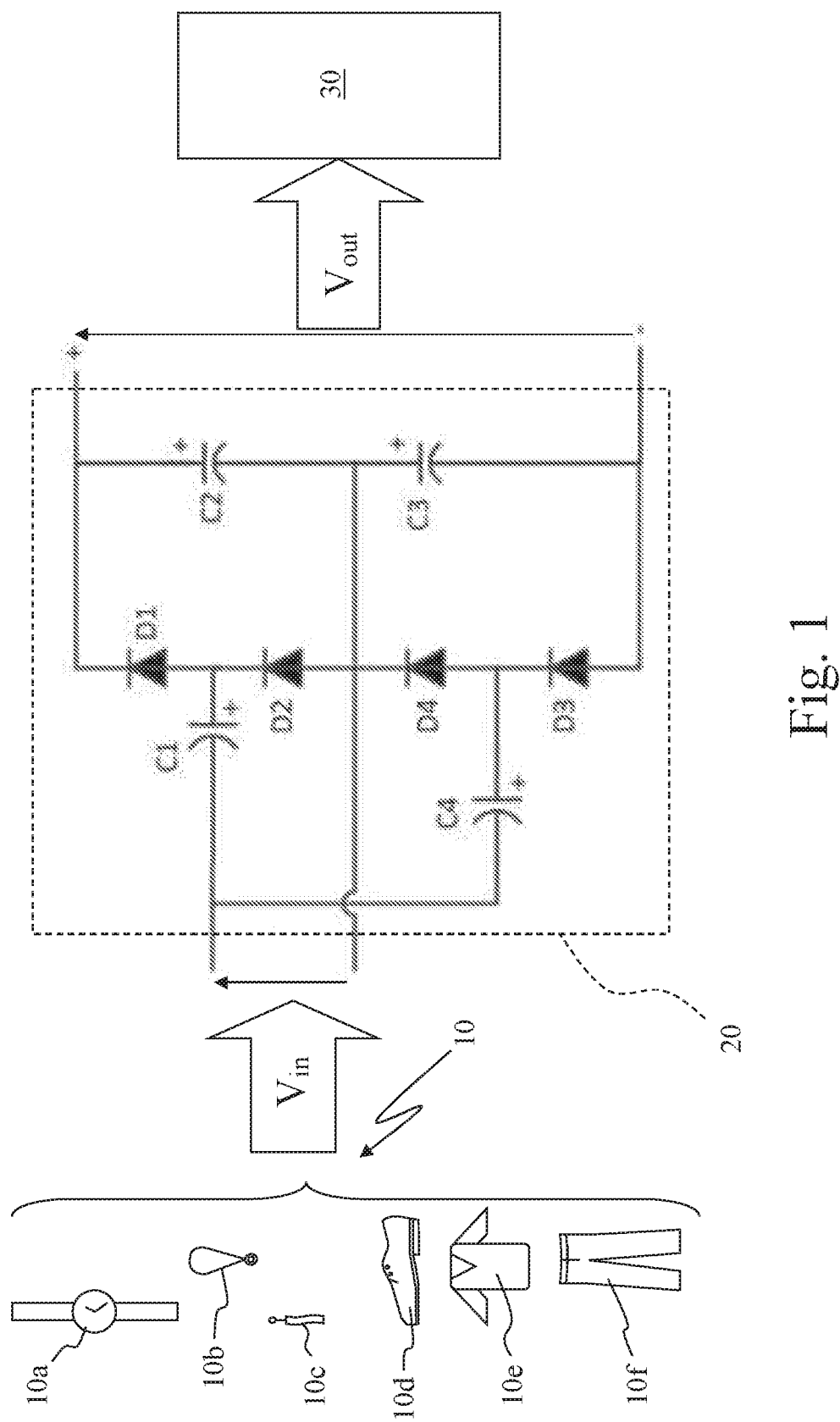
FIG. 1 shows a schematic representation of a possible embodiment of the present invention.

In particular, FIG. 1 schematically represents the detection and measurement of RF exposure on human's body wearing a device 10 including conductive elements which form at least part of an antenna and comprising a control unit 30.

The wearable device, which will be referred in the following with the general reference number 10, could be for example, a part of a wrist watch 10a, a necklace 10b, an earring 10c, a shoe 10d, a shirt 10e, a part of trousers 10f such as jeans or the like, or actually anything having a good portion in contact with the wearer's body.

The scheme of the electrical circuit shown on FIG. 1 represents a RF-to-DC converter 20, connected to the control unit 30, which is used to convert AC into DC. The control unit 30 receives the output voltage $V_{out}$ from the RF-to-DC converter 20 and transforms this analog value into a digital value.

The RF-to-DC converter 20 and the control unit 30 are incorporated into the device 10 worn by an individual, for example by housing them in some parts of the wearable device such as straps, labels, buttons or the like.

The electrical circuit of the RF-to-DC converter 20 comprises a diode/capacitor multiplier circuit having an input $V_{in}$ from the RF radiation and static electricity received in form of AC currents from the wearer's body and from the conductive elements of the wearable device, both acting as antennas. In particular, four diodes D1, D2, D3, D4 and four capacitors C1, C2. C3, C4 are used in this specific example; usage of more stages for voltage multiplication is also possible, though. The RF-to-DC converter 20 allows the harvested energy in form of AC currents to charge the capacitors C1-C4 and to provide a DC current output $V_{out}$ which is multiplied four times with respect to the input $V_{in}$.

In this specific example C1 and C4 are input capacitors for DC de-coupling. C2 and C3 are those actually charged/discharged to increment a counter. C1 and C4, usually of ceramic type with no polarity, are also charged and discharged continuously but they have a rather small capacity (e.g. nF) compared to C2 and C3. The latter are of electrolytic type, with polarity, and have a larger capacity (e.g. μF) with respect to C1 and C4.

Figure 2:
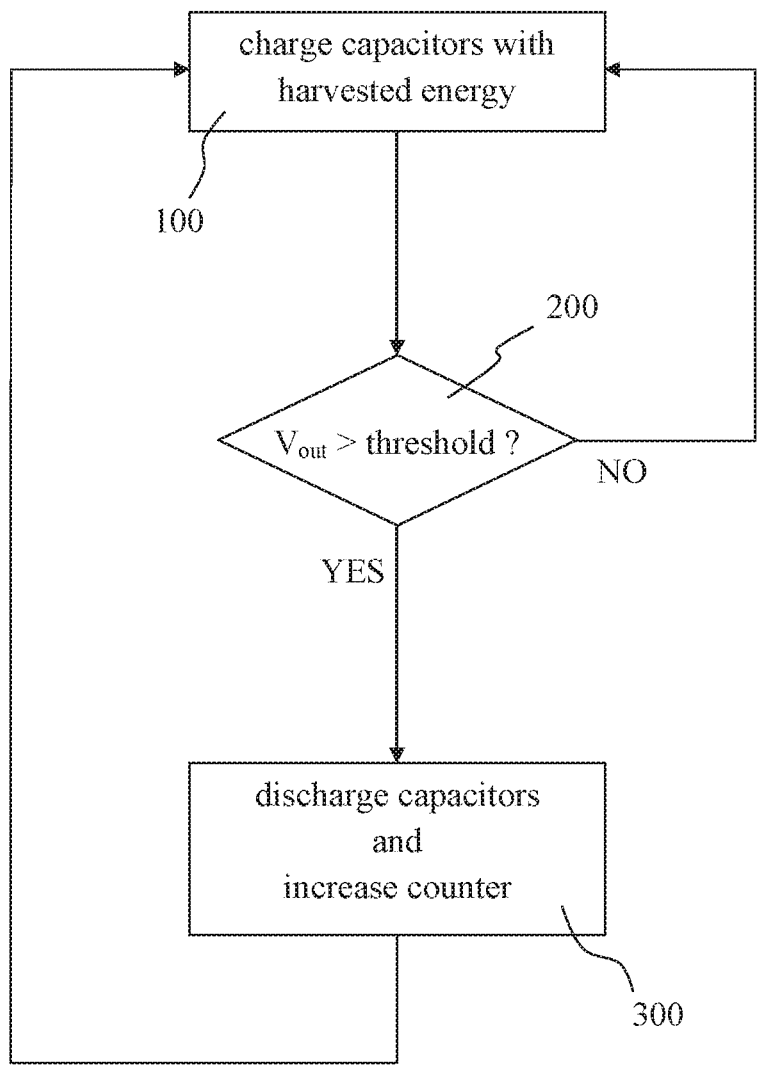
FIG. 2 is a flowchart which shows some steps of the method according to the present invention.

As shown in FIG. 2, the capacitors C2-C3 are continuously charged by the harvested energy at step 100 and the output voltage $V_{out}$ from the RF-to-DC converter is fed to the control unit 30. The latter is programmed to convert the analog voltage value $V_{out}$ and continuously compare at step 200 the corresponding digital value with a threshold value stored into a memory of the control unit 30.

If the value $V_{out}$ is smaller than the threshold value, the steps of charging the capacitors C2-C3 with harvested energy and feeding the output $V_{out}$ to the control unit 30 continues until $V_{out}$ does not exceed the threshold value. Once this condition is reached, capacitors C2-C3 are discharged and the integer value of the counter is increased at step 300 and the process restart again from step 100.

While at least one exemplary embodiment has been presented in the foregoing summary and detailed description, it should be appreciated that a vast number of variations exist. For example, even if the wearable device of the present invention has been disclosed as operating in a range of RF frequencies without specific limits, it should be understood that the principles of the present invention can be applied also to wearable devices operating at specific frequencies or small ranges of frequency.

It should also be appreciated that the exemplary embodiments are only examples, and are not intended to limit the scope, applicability, or configuration in any way. Rather, the foregoing detailed description will provide those skilled in the art with a convenient road map for implementing at least one exemplary embodiment, it being understood that various changes may be made in the function and arrangement of elements described in an exemplary embodiment without departing from the scope as set forth in the appended claims.

The invention claimed is:

1. A wearable device comprising conductive elements which form at least part of an antenna, an RF-to-DC converter connected to said conductive elements for harvesting RF energy and induced static electricity variation at the input in the form of an AC voltage (Vin), said RF-to-DC converter providing a DC voltage (Vout) at the output, and a control unit connected to the output of said RF-to-DC converter to determine the induced voltage exposure of a device wearer's body, wherein said conductive elements are configured to be in electrical contact with the wearer's body.

2. The wearable device according to claim 1, wherein said conductive elements are incorporated in a fabric.

3. The wearable device according to claim 1, wherein said RF-to-DC converter comprises a diode/capacitor multiplier circuit.

4. The wearable device according to claim 1, wherein said control unit is programmed to set a threshold voltage value to be compared with said DC voltage value $V_{out}$ at the output of said RF-to-DC converter.

5. The wearable device according to claim 1, wherein said control unit and or said RF-to-DC converter are attached to, or incorporated in, the fabric.

6. The wearable device according to claim 2, wherein said control unit and or said RF-to-DC converter are attached to, or incorporated in, the fabric.

7. The wearable device according to claim 3, wherein said control unit and or said RF-to-DC converter are attached to, or incorporated in, the fabric.

8. The wearable device according to claim 4, wherein said control unit and or said RF-to-DC converter are attached to, or incorporated in, the fabric.

9. A method for determining the induced voltage exposure of a human's body wearing a wearable device according to claim 1, characterized by comprising the following steps:
   a) continuously harvesting RF energy or static electricity variation induced on the device wearer's body by means of conductive elements and the wearer's body acting as antennas, wherein said conductive elements are configured to be in electrical contact to the wearer's body;
   b) feeding an RF-to-DC converter with an AC voltage ($V_{in}$) from the harvesting step a) to charge the capacitors (C2-C3) of said RF-to-DC converter in order to obtain a DC voltage ($V_{out}$) at the output of said RF-to-DC converter;
   c) evaluating the amount of the induced voltage exposure on the basis of said DC voltage ($V_{out}$) fed to the control unit of said wearable device.

10. The method according to claim 9, wherein said control unit is programmed to compare said DC voltage ($V_{out}$) with a preset threshold voltage level and to increase the integer value of an internal counter when said DC voltage ($V_{out}$) exceeds said preset threshold voltage level.

11. The method according to claim 10, wherein said capacitors (C2-C3) are discharged when said DC voltage ($V_{out}$) exceeds said preset threshold voltage level.

12. The method according to claim 10, wherein said threshold voltage level is stored in said control unit as a digital value, and wherein said DC voltage ($V_{out}$) is converted by said control unit from the analog to digital form before the comparison.

13. The method according to claim 9, wherein the integer value of the counter is periodically read in order to report the integer value stored in the counter and determine the induced voltage exposure on the wearer's body.

14. The method according to claim 13, wherein the counter value is reset after a reading of the stored integer value.

15. The method according to claim 10, wherein the integer value of the counter is periodically read in order to report the integer value stored in the counter and determine the induced voltage exposure on the wearer's body.

16. The method according to claim 11, wherein the integer value of the counter is periodically read in order to report the integer value stored in the counter and determine the induced voltage exposure on the wearer's body.

17. The method according to claim 12, wherein the integer value of the counter is periodically read in order to report the integer value stored in the counter and determine the induced voltage exposure on the wearer's body.

* * * * *